United States Patent
Lee

(10) Patent No.: US 9,459,318 B2
(45) Date of Patent: Oct. 4, 2016

(54) SEMICONDUCTOR CHIP, STACK CHIP INCLUDING THE SAME, AND TESTING METHOD THEREOF

(71) Applicant: SK hynix Inc., Icheon-si Gyeonggi-do (KR)

(72) Inventor: Tae Yong Lee, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 325 days.

(21) Appl. No.: 14/158,117

(22) Filed: Jan. 17, 2014

(65) Prior Publication Data

US 2015/0177320 A1   Jun. 25, 2015

(30) Foreign Application Priority Data

Dec. 23, 2013  (KR) .................. 10-2013-0161587

(51) Int. Cl.
| | |
|---|---|
| *G01R 31/3177* | (2006.01) |
| *H01L 25/065* | (2006.01) |
| *G01R 31/28* | (2006.01) |
| *G01R 31/3185* | (2006.01) |
| *G01R 31/40* | (2014.01) |
| *H01L 23/00* | (2006.01) |

(52) U.S. Cl.
CPC ......... *G01R 31/3177* (2013.01); *G01R 31/281* (2013.01); *G01R 31/2803* (2013.01); *G01R 31/318513* (2013.01); *G01R 31/318536* (2013.01); *G01R 31/318572* (2013.01); *H01L 25/0657* (2013.01); *H01L 24/16* (2013.01); *H01L 2224/13023* (2013.01); *H01L 2224/13025* (2013.01); *H01L 2224/16146* (2013.01); *H01L 2224/17181* (2013.01); *H01L 2225/06513* (2013.01); *H01L 2225/06517* (2013.01); *H01L 2225/06596* (2013.01)

(58) Field of Classification Search
CPC .......... G01R 31/3177; G01R 31/2803; G01R 31/281; G01R 31/318513; G01R 31/318536; G01R 31/318572; H01L 24/16; H01L 25/0657; H01L 2224/13023; H01L 2224/13025; H01L 2225/06513; H01L 2225/06517; H01L 2225/06596
See application file for complete search history.

(56) References Cited

U.S. PATENT DOCUMENTS

| | | | | |
|---|---|---|---|---|
| 4,813,018 A | * | 3/1989 | Kobayashi ............. | G11C 14/00 365/185.07 |
| 4,931,722 A | * | 6/1990 | Stoica ............ | G01R 31/318536 324/750.3 |
| 5,473,617 A | * | 12/1995 | Farwell ............ | G01R 31/31715 714/727 |
| 5,563,959 A | * | 10/1996 | Gallo ................... | G06K 9/4609 382/187 |
| 5,664,089 A | * | 9/1997 | Byers ................... | G06F 11/1415 714/14 |
| 7,270,008 B1 | * | 9/2007 | DeAnna ................. | G01M 7/02 73/663 |
| 2005/0117420 A1 | * | 6/2005 | Jeon ....................... | G11C 29/14 365/202 |

(Continued)

FOREIGN PATENT DOCUMENTS

KR   1020120119960 A   11/2012

*Primary Examiner* — Cynthia Britt
*Assistant Examiner* — Dipakkumar Gandhi
(74) *Attorney, Agent, or Firm* — William Park & Associates Ltd.

(57) ABSTRACT

A semiconductor chip includes an input pad and an output pad formed on the semiconductor chip; at least one bump formed on the semiconductor chip; and a test scan chain configured to output data applied from the input pad, to a node which is electrically coupled with the bump, store data corresponding to capacitance of the node by floating the node for a predetermined time, and output data corresponding to the stored capacitance, to the output pad.

18 Claims, 8 Drawing Sheets

(56) References Cited

U.S. PATENT DOCUMENTS

| | | | | |
|---|---|---|---|---|
| 2007/0226560 A1* | 9/2007 | Uchida | G01R 31/318575 | 714/724 |
| 2012/0257314 A1* | 10/2012 | Armstrong | G01R 31/3272 | 361/42 |
| 2012/0272112 A1* | 10/2012 | Oh | H01L 23/481 | 714/727 |

* cited by examiner

SEMICONDUCTOR CHIP, STACK CHIP INCLUDING THE SAME, AND TESTING METHOD THEREOF

CROSS-REFERENCES TO RELATED APPLICATION

The present application claims priority under 35 U.S.C. §119(a) to Korean application number 10-2013-0161587, filed on Dec. 23, 2013, in the Korean Intellectual Property Office, which is incorporated herein by reference in its entirety.

BACKGROUND

1. Technical Field

Various embodiments generally relate to a semiconductor chip, a stack chip including the same and a testing method thereof, and more particularly, to a technology for testing a fail of a bump in a stack chip.

2. Related Art

As the development of the electronics industry rapidly proceeds, light weight, scale-down, high speed operation, multi-functionality and high performance are demanded by users. One of the electronic product assembly technologies developed according to such demands is a chip scale package or a chip size package.

The chip scale package may significantly reduce the thickness or size of a semiconductor or a system-on-chip package. In the case where a semiconductor device or system-on-chips of the chip scale package are stacked, micro bumps may be disposed to ease the physical contact between stacked chips.

In a conventional memory device, an input/output buffer is directly electrically coupled to a bonding pad. That is to say, in a chip where bonding is performed, a wafer test is performed through a bonding pad. Accordingly, by directly performing a probe test through a bonding pad before performing wire bonding, input leakage current of an input/output buffer may be tested. In particular, a test for input leakage current through a bonding pad may be directly performed among various test items.

As a stack memory is developed, a memory to be directly stacked on a system-on-chip has a structure which is electrically coupled with the underlying system-on-chip not through wire bonding but through micro bumps.

In the memory having such a structure, because input/output buffers are electrically coupled to the micro bumps, it is impossible to perform a probe test by directing contacting the micro bumps. In other words, in a memory using TSVs (through-silicon vias) and micro bump pads as a new memory type, it is impossible to perform a test by directly probing micro bumps.

Even though a probe test is directly performed for micro bumps, a micro bump which is contaminated after the test is not likely to be electrically coupled well when stacking a system-on-chip. Namely, in the case of directly probing micro bumps, the shapes of the micro bumps may be changed attributable to attacks by probe pins.

According to this fact, when stacking is performed using a bump which is contaminated after testing, various fails such as an open circuit or a short circuit are likely to occur. As a consequence, if leakage current occurs in a bump or an input/output buffer electrically coupled with the bump, it is not easy to find the leakage current.

SUMMARY

A technology for testing a fail of a bump without directly probing bumps in a stack chip which is electrically coupled through bumps is described herein.

In an embodiment of the present disclosure, a semiconductor chip includes: an input pad and an output pad formed on the semiconductor chip; at least one bump formed on the semiconductor chip; and a test scan chain configured to output data applied from the input pad, to a node which is electrically coupled with the bump, store data corresponding to capacitance of the node by floating the node for a predetermined time, and output data corresponding to the stored capacitance, to the output pad.

In an embodiment of the present disclosure, a stack chip includes: a first chip; a second chip stacked over the first chip; an input pad and an output pad formed on the second chip; at least one bump configured to electrically couple the first chip and the second chip with each other; and a test scan chain configured to output data applied from the input pad, to a node which is electrically coupled with the bump, store data corresponding to capacitance of the node by floating the node for a predetermined time, and output data corresponding to the stored capacitance, to the output pad.

In an embodiment of the present disclosure, a stack chip includes: a first chip; a second chip stacked over the first chip; a plurality of bumps configured to electrically couple the first chip and the second chip with each other; and a test scan chain configured to output data applied from the first chip through an input bump, to nodes which are electrically coupled with the plurality of bumps, float the nodes for a predetermined time, store data corresponding to capacitance of the nodes, and output the stored data corresponding to capacitance, to the first chip through an output bump.

In an embodiment of the present disclosure, a stack chip includes: a first chip; a second chip stacked over the first chip; a plurality of bumps configured to electrically couple the first chip and the second chip with each other; and a test scan chain configured to output in parallel data applied from the first chip through the plurality of bumps, to nodes which are formed in the second chip, float the nodes for a predetermined time, store data corresponding to capacitance of the nodes, and output in parallel the stored data corresponding to capacitance, to the first chip through the plurality of bumps.

In an embodiment of the present disclosure, a method for testing a stack chip includes: storing data applied through an input pad, in respective storage units; outputting data stored in the respective storage units, to nodes which are electrically coupled with bumps, when respective output buffers are turned on in correspondence to a select signal; floating the nodes when driving buffers are turned off in correspondence to the select signal, and charging data corresponding to capacitance in the nodes for a predetermined time; outputting the data corresponding to the capacitance, charged in the nodes, to the respective storage units in correspondence to a control clock; and outputting data stored in the respective storage units, through an output node.

BRIEF DESCRIPTION OF THE DRAWINGS

Features, aspects, and embodiments are described in conjunction with the attached drawings, in which.

DETAILED DESCRIPTION

Figure 1:
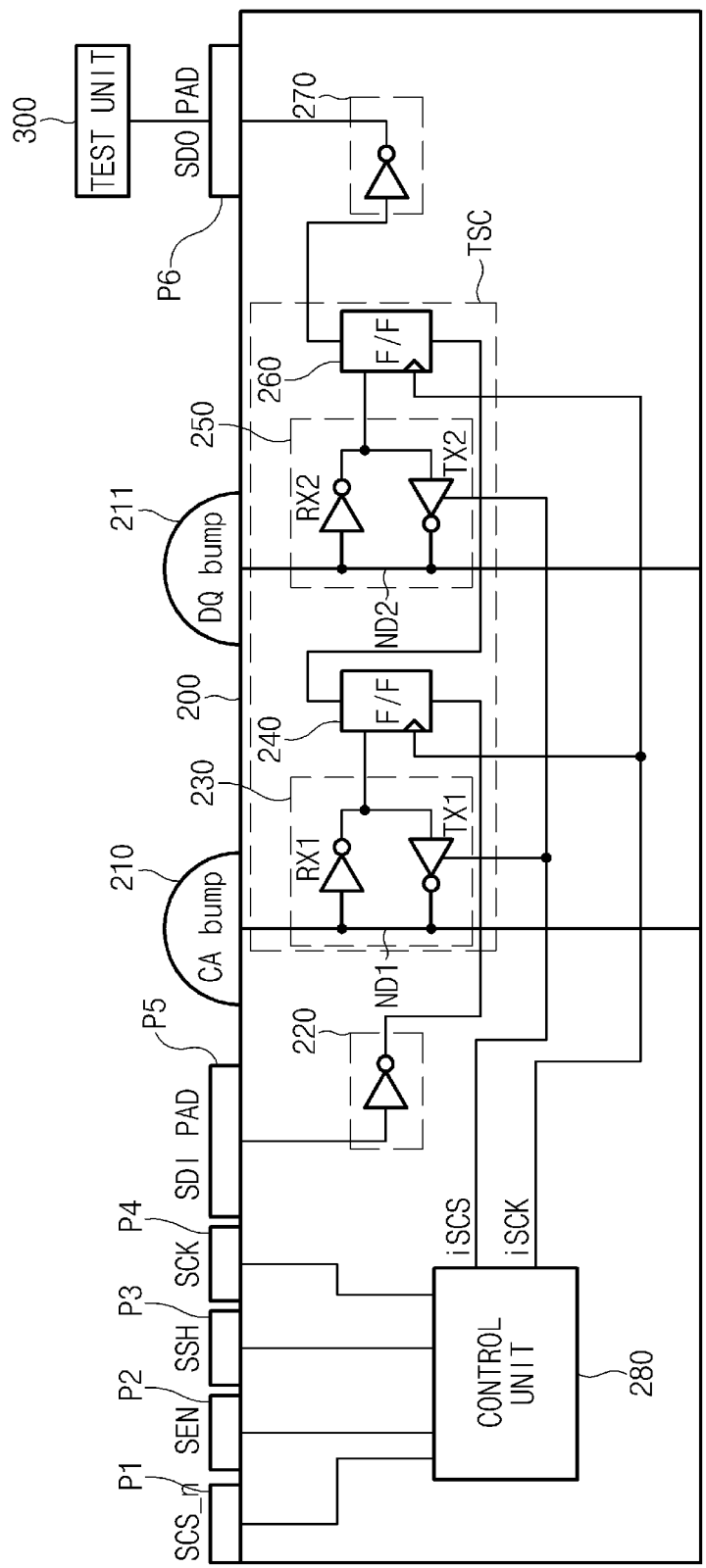
FIG. 1 is a configuration diagram of a semiconductor chip in accordance with an embodiment of the present disclosure.

Hereinafter, a semiconductor chip, a stack chip including the same and a testing method thereof according to the present disclosure will be described below with reference to the accompanying drawings through various examples of embodiments. As such, like reference numerals or characters refer to like elements throughout the specification and drawings unless otherwise noted.

FIG. 1 is a configuration diagram of a semiconductor chip in accordance with an embodiment of the present disclosure.

A semiconductor chip 200 in accordance with an embodiment of the present disclosure includes a plurality of pads P1 to P6, buffers 220 and 270, driving buffers 230 and 250, storage units 240 and 260, and a control unit 280.

The semiconductor chip 200 in accordance with the embodiment of the present disclosure may be electrically coupled by through-silicon vias (TSVs) which are electrically coupled with bumps. While it is, for example, described in the embodiment of the present disclosure that the semiconductor chip 200 does not include TSVs, it is to be noted that the present disclosure is not limited to such and the semiconductor chip 200 may include TSVs.

A bump 210 may be a bump for transferring a command and an address (CA) between different chips in the semiconductor chip 200. A bump 211 may be a bump for transferring data (DQ) between different chips in the semiconductor chip 200.

While it is described in the embodiment of the present disclosure that the number of the bumps 210 and 211 is two, it is to be noted that the embodiment of the present disclosure is not limited to such and each chip may include a plurality of bumps.

The bumps 210 and 211 determine the connectivity between different chips. The connectivity of the micro bumps 210 and 211 is regarded as an important factor in determining the occurrence of a fail in the semiconductor chip 200. Therefore, a method for detecting a connectivity fail of the micro bumps 210 and 211 is required.

As a method for testing a fail of the micro bumps 210 and 211, a boundary scan test (BST) may be used. In the boundary scan test, whether or not the micro bumps 210 and 211 are electrically coupled to corresponding devices is tested.

To this end, the semiconductor chip 200 includes the plurality of pads P1 to P6, the buffers 220 and 270, the driving buffers 230 and 250, the storage units 240 and 260, and the control unit 280. The semiconductor chip 200 is allocated with the plurality of pads P1 to P6 through which corresponding signals are inputted and outputted to perform the boundary scan test.

The driving buffer 230, the storage unit 240, the driving buffer 250 and the storage unit 260 constitute a test scan chain TSC. In the test scan chain TSC, the driving buffer 230, the storage unit 240, the driving buffer 250 and the storage unit 260 which are electrically coupled in series are continuously electrically coupled.

While it is, for example, described in the embodiment of the present disclosure that the test scan chain TSC is constituted by the two driving buffers 230 and 250 and the two storage units 240 and 260, it is to be noted that the embodiment of the present disclosure is not limited to such and the test scan chain TSC may include a plurality of driving buffers and a plurality of storage units which are alternately electrically coupled in series.

The pad P1 is a pad for being inputted with a scan chip select signal SCS_n. The pad P2 is a pad which is inputted with a scan enable signal SEN for enabling the test scan chain TSC. The pad P3 is a pad which is inputted with a scan shift signal SSH for selecting the operation mode of the test scan chain TSC. The pad P4 is a pad for being inputted with a scan clock SCK.

The pad P5 is an input pad for being inputted with a scan input signal SDI. The pad P6 is an output pad for outputting a scan output signal SDO. The pads P5 and P6 are provided to allow data to be inputted and outputted, since it is impossible to directly perform a probe test for the micro bumps 210 and 211. While it is, for example, described in the embodiment of the present disclosure that the input pad P5 and the output pad P6 respectively inputs and outputs serial data, it is to be noted that the embodiment of the present disclosure is not limited to such.

The control unit 280 is configured to be inputted with the scan chip select signal SCS_n, the scan enable signal SEN, the scan shift signal SSH and the scan clock SCK through the plurality of pads P1 to P4, and control the operation mode of the test scan chain TSC. The control unit 280 may selectively enable the test scan chain TSC in response to the logic level of the scan enable signal SEN.

By combing such input signals, the control unit 280 outputs a select signal iSCS to the driving buffers 230 and 250 and outputs a control clock iSCK to the storage units 240 and 260. The control unit 280 may operate the test scan chain TSC in a parallel input/output mode, a parallel input mode or a parallel output mode in response to the logic level of the scan enable signal SEN.

The buffer 220 may be configured to buffer the scan input signal SDI applied from the pad P5, and output a resultant signal to the storage unit 240. The buffer 270 may be configured to buffer the data outputted from the storage unit 260, and output the scan output signal SDO to the pad P6.

The driving buffer 230 includes an input buffer RX1 and an output buffer TX1 which are electrically coupled to a node ND1. The node ND1 is electrically coupled with the bump 210. The input buffer RX1 is configured to receive an input signal through the node ND1 and output a signal to the storage unit 240. The output buffer TX1 is configured to output the data stored in the storage unit 240 to the node ND1 according to control of the select signal iSCS.

The storage unit 240 may include a flip-flop. The storage unit 240 is configured to store the scan input signal SDI applied from the pad P5, in synchronization with the control clock iSCK.

The driving buffer 250 includes an input buffer RX2 and an output buffer TX2 which are electrically coupled to a node ND2. The node ND2 is electrically coupled with the bump 211. The input buffer RX2 is configured to receive an input signal through the node ND2 and output a signal to the storage unit 260. The output buffer TX2 is configured to output the data stored in the storage unit 260 to the node ND2 according to control of the select signal iSCS.

The storage unit 260 may include a flip-flop. The storage unit 260 is configured to store the data shift-inputted from the storage unit 240, in synchronization with the control clock iSCK. The output of the storage unit 260 is outputted through the pad P6 as the scan output signal SDO.

An external test unit 300 may be configured to monitor whether or not the scan input signal SDI inputted through the pad P5 is outputted as the scan output signal SDO through the pad P6.

If the scan input signal SDI inputted through the pad P5 is normally outputted as the scan output signal SDO through the pad P6, the test unit 300 may determine that leakage current has not occurred in the micro bumps 210 and 211. Normally outputted mean that a voltage logic level of the scan input signal SDI equals a voltage logic level of the scan output signal SDO. Conversely, if the scan input signal SDI inputted through the pad P5 is not normally outputted as the scan output signal SDO through the pad P6, the test unit 300 may determine that the micro bumps 210 and 211 are opened or short-circuited and leakage current has occurred.

Figure 2:
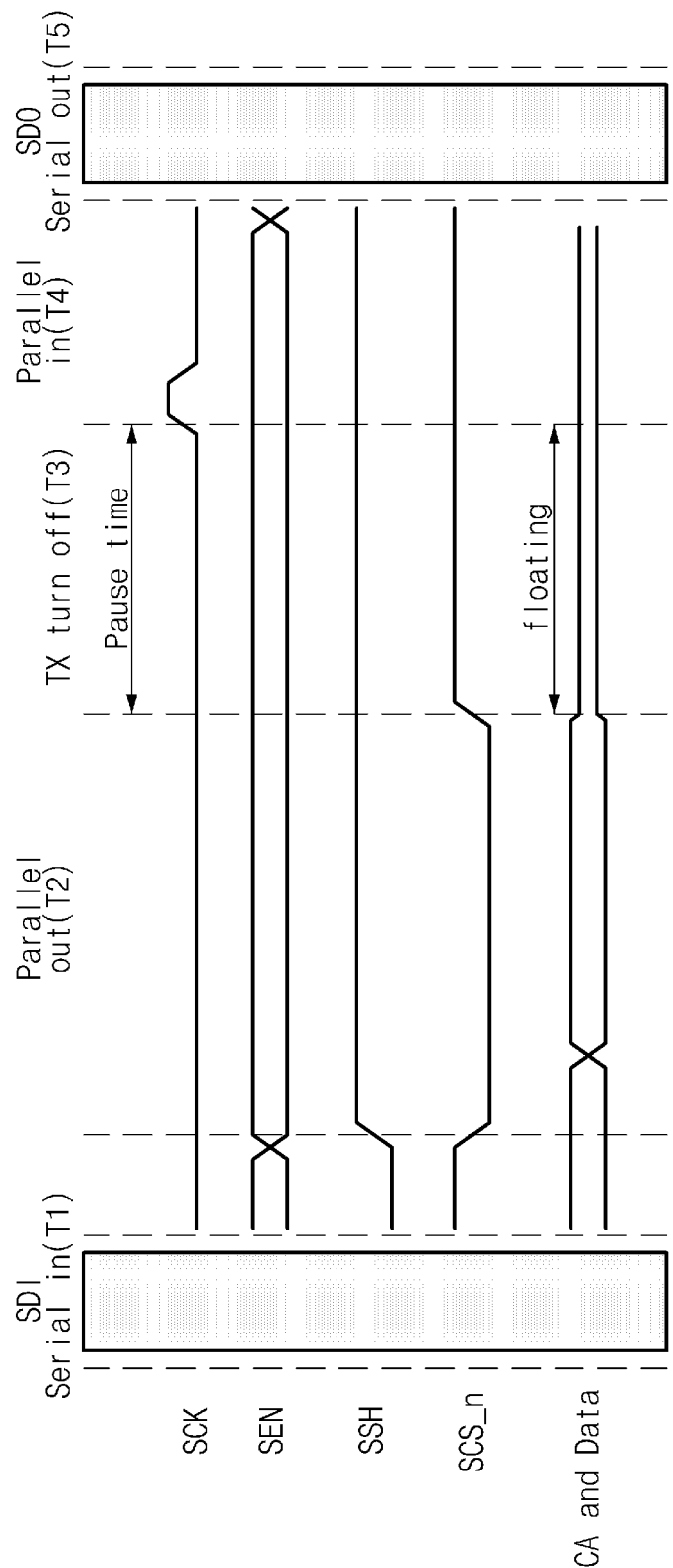
FIG. 2 is a timing diagram explaining a method for testing the semiconductor chip in accordance with the embodiment of the present disclosure.

FIG. 2 is a timing diagram explaining a method for testing the semiconductor chip of FIG. 1. The testing method in accordance with the embodiment of the present disclosure may be performed through five periods.

First, the scan input signal SDI is inputted in series through the pad P5 (a period T1). Accordingly, the expected values of the respective bumps 210 and 211 are stored in the respective storage units 240 and 260 according to the data applied through the input buffers RX1 and RX2. The expected values stored in the respective storage units 240 and 260 may be data with the same level (i.e., voltage level). The expected values stored in the respective storage units 240 and 260 may be logic high values or logic low values (i.e., logic high voltage level and logic low voltage level values).

Thereafter, as the scan enable signal SEN is enabled, the scan shift signal SSH is enabled to a high level, and the scan chip select signal SCS_n becomes a low level. Then, the output buffer TX1 of the driving buffer 230 and the output buffer TX2 of the driving buffer 250 are turned on by the select signal iSCS. According to this fact, the data stored in the respective storage units 240 and 260 are outputted in parallel to the bumps 210 and 211 through the nodes ND1 and ND2 (a period T2).

Next, the scan chip select signal SCS_n becomes a high level. Then, the output buffer TX1 of the driving buffer 230 and the output buffer TX2 of the driving buffer 250 are turned off by the select signal iSCS (a period T3). According to this fact, as the driving buffers 230 and 250 do not operate for the period T3 as a pause time, the nodes ND1 and ND2 become floating states. Accordingly, data is charged in the nodes ND1 and ND2 by using the capacitance of the floated nodes ND1 and ND2.

As the scan clock SCK toggles to a high level, the respective storage units 240 and 260 operate in response to the control clock iSCK (a period T4). Then, the data charged in the floated nodes ND1 and ND2 are inputted in parallel through the input buffers RX1 and RX2 of the driving buffers 230 and 250 and are stored in the storage units 240 and 260.

If the scan enable signal SEN is enabled, a state results, in which the entire test scan chain TSC does not operate. The data stored in the respective storage units 240 and 260 are outputted in series as the scan output signal SDO through the pad P6 (a period T5). The external test unit 300 may discriminate the expected values of the respective bumps 210 and 211 which are read, and may determine whether or not leakage current or a fail of a bump has occurred.

Figure 3:
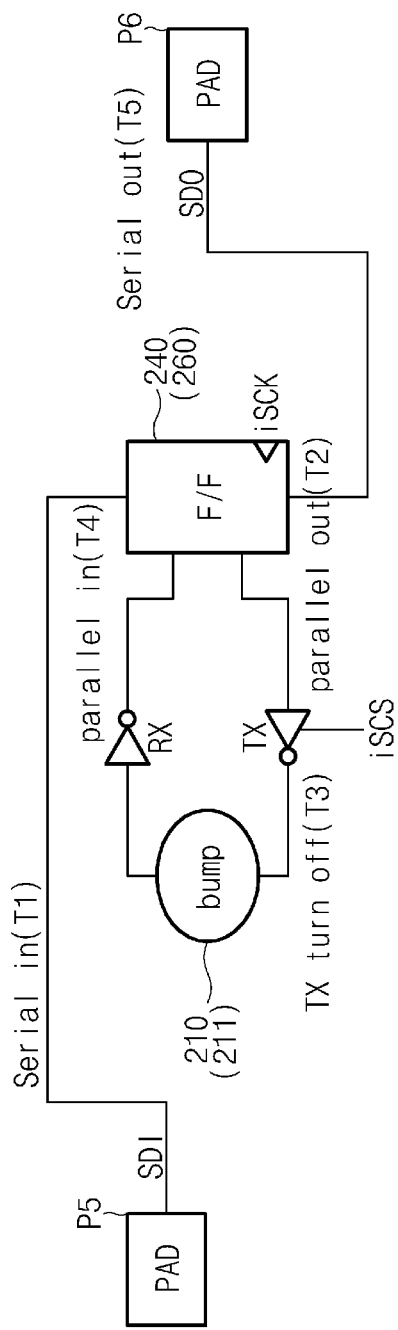
FIG. 3 is a diagram conceptually explaining the timing diagram of FIG. 2.

FIG. 3 is a diagram conceptually explaining the timing diagram of FIG. 2.

As described above, the testing method in accordance with the embodiment of the present disclosure is performed through the five periods.

In the period T1, the scan input signal SDI is inputted in series to the respective storage units 240 and 260 through the pad P5. Thereafter, in the period T2, the output buffers TX1 and TX2 (i.e., TX) are turned on by the select signal iSCS, and the data stored in the respective storage units 240 and 260 are outputted in parallel to the bumps 210 and 211.

In the period T3, the output buffers TX1 and TX2 are turned off by the select signal iSCS, the nodes ND1 and ND2 become floating states, and data are charged in the nodes ND1 and ND2. In the period T4, the respective storage units 240 and 260 operate in response to the control clock iSCK, and the data charged in the nodes ND1 and ND2 are inputted in parallel to the storage units 240 and 260. Thereafter, in the period T5, the data stored in the respective storage units 240 and 260 are outputted in series as the scan output signal SDO to the pad P6.

Figure 4:
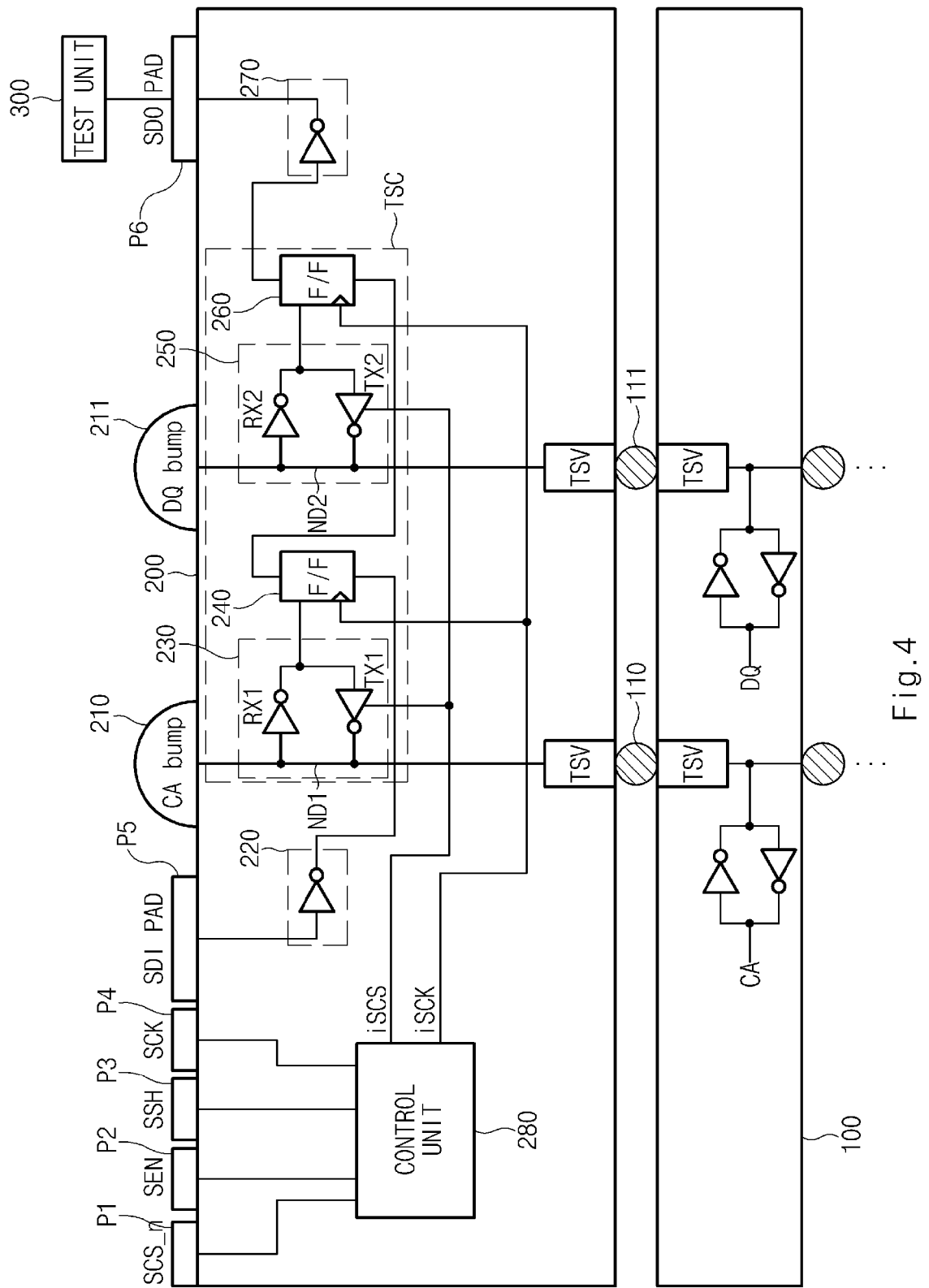
FIG. 4 is a configuration diagram of a stack chip in accordance with an embodiment of the present disclosure.

FIG. 4 is a configuration diagram of a stack chip in accordance with an embodiment of the present disclosure.

In a stack chip in accordance with an embodiment of the present disclosure, a first chip 100 and a second chip 200 are stacked. The first chip 100 and the second chip 200 may be electrically coupled with each other by micro bumps 110 and 111.

Each of the chips 100 and 200 may be a system-on-chip, a semiconductor memory chip or a memory die. Also, each of the chips 100 and 200 may be an interface chip for interfacing an outside and data or may be a logic element chip. Further, each of the chips 100 and 200 may be a memory controller for controlling the operations of memory layers. Moreover, the first chip 100 may be a system-on-chip, and the second chip 200 may be a semiconductor chip. The kinds of the chips 100 and 200 are not specifically limited.

The respective chips 100 and 200 may be electrically coupled with each other by through-silicon vias TSV which are electrically coupled with the bumps 110 and 111. The bumps 110 and 111 of the second chip 200 may be electrically coupled with the underlying first chip 100 by contacting the through-silicon vias TSV.

While it is, for example, described in the embodiment of the present disclosure that both the first chip 100 and the second chip 200 include the through-silicon vias TSV, it is to be noted that the embodiment of the present disclosure is not limited to such and the respective chips 100 and 200 may not include through-silicon vias and may be directly electrically coupled through the bumps 110 and 111.

While it is described in the embodiment of the present disclosure that the number of the bumps 110 and 111 is two, it is to be noted that the embodiment of the present disclosure is not limited to such and each chip may include a plurality of bumps.

Bumps 110 and 210 may be bumps for transferring a command and an address (CA) between the respective chips 100 and 200 in the stack chip. Bumps 111 and 211 may be bumps for transferring data (DQ) between the respective chips 100 and 200 in the stack chip.

These bumps 110, 111, 210 and 211 determine the connectivity between different devices, that is, stack chips each including the first chip 100 and the second chip 200. The connectivity of the micro bumps 110, 111, 210 and 211 is regarded as an important factor in determining the occurrence of a fail in the stack chip. Therefore, a method for detecting leakage current and a connectivity fail of the micro bumps 110, 111, 210 and 211 is required.

As a method for testing a fail of the micro bumps 110, 111, 210 and 211, a boundary scan test (BST) may be used. In the boundary scan test, whether or not the micro bumps 110, 111, 210 and 211 are electrically coupled to corresponding devices, that is, the first chip 100 and the second chip 200, is tested, or whether or not leakage current has occurred is tested.

To this end, the second chip 200 includes a plurality of pads P1 to P6, buffers 220 and 270, driving buffers 230 and 250, storage units 240 and 260, and a control unit 280. The second chip 200 is allocated with the plurality of pads P1 to P6 through which corresponding signals are inputted and outputted to perform the boundary scan test.

The driving buffer 230, the storage unit 240, the driving buffer 250 and the storage unit 260 constitute a test scan chain TSC. In the test scan chain TSC, the driving buffer 230, the storage unit 240, the driving buffer 250 and the storage unit 260 which are electrically coupled in series and are continuously electrically coupled.

While it is, for example described in the embodiment of the present disclosure that the test scan chain TSC is constituted by the two driving buffers 230 and 250 and the two storage units 240 and 260, it is to be noted that the embodiment of the present disclosure is not limited to such and the test scan chain TSC may include a plurality of driving buffers and a plurality of storage units which are alternately electrically coupled in series.

While it is, for example described in the embodiment of the present disclosure that the test scan chain TSC is formed in the second chip 200, it is to be noted that the embodiment of the present disclosure is not limited to such and the test scan chain TSC may be formed in the first chip 100 or another chip.

The pad P1 is a pad for being inputted with a scan chip select signal SCS_n. The pad P2 is a pad which is inputted with a scan enable signal SEN for enabling the test scan chain TSC. The pad P3 is a pad which is inputted with a scan shift signal SSH for selecting the operation mode of the test scan chain TSC. The pad P4 is a pad for being inputted with a scan clock SCK.

The pad P5 is an input pad for being inputted with a scan input signal SDI. The pad P6 is an output pad for outputting a scan output signal SDO. The pads P5 and P6 are provided to allow data to be inputted and outputted, since it is impossible to directly perform a probe test for the micro bumps 210 and 211. While it is, for example, described in the embodiment of the present disclosure that the input pad P5 and the output pad P6 respectively inputs and outputs serial data, it is to be noted that the embodiment of the present disclosure is not limited to such.

The control unit 280 is configured to be inputted with the scan chip select signal SCS_n, the scan enable signal SEN, the scan shift signal SSH and the scan clock SCK through the plurality of pads P1 to P4, and control the operation mode of the test scan chain TSC. The control unit 280 may selectively enable the test scan chain TSC in response to the logic level of the scan enable signal SEN.

By combing such input signals, the control unit 280 outputs a select signal iSCS to the driving buffers 230 and 250 and outputs a control clock iSCK to the storage units 240 and 260. The control unit 280 may operate the test scan chain TSC in a parallel input/output mode, a parallel input mode or a parallel output mode in response to the logic level of the scan enable signal SEN.

The buffer 220 may be configured to buffer the scan input signal SDI applied from the pad P5, and output a resultant signal to the storage unit 240. The buffer 270 may be configured to buffer the data outputted from the storage unit 260, and output the scan output signal SDO to the pad P6.

The driving buffer 230 includes an input buffer RX1 and an output buffer TX1 which are electrically coupled to a node ND1. The node ND1 is electrically coupled with the bump 210. The input buffer RX1 is configured to receive an input signal through the node ND1 and output a signal to the storage unit 240. The output buffer TX1 is configured to output the data stored in the storage unit 240 to the node ND1 according to control of the select signal iSCS.

The storage unit 240 may include a flip-flop. The storage unit 240 is configured to store the scan input signal SDI applied from the pad P5, in synchronization with the control clock iSCK.

The driving buffer 250 includes an input buffer RX2 and an output buffer TX2 which are electrically coupled to a node ND2. The node ND2 is electrically coupled with the bump 211. The input buffer RX2 is configured to receive an input signal through the node ND2 and output a signal to the storage unit 260. The output buffer TX2 is configured to output the data stored in the storage unit 260 to the node ND2 according to control of the select signal iSCS.

The storage unit 260 may include a flip-flop. The storage unit 260 is configured to store the data shift-inputted from the storage unit 240, in synchronization with the control clock iSCK. The output of the storage unit 260 is outputted through the pad P6 as the scan output signal SDO.

An external test unit 300 may be configured to monitor whether or not the scan input signal SDI inputted through the pad P5 is outputted as the scan output signal SDO through the pad P6.

If the scan input signal SDI inputted through the pad P5 is normally outputted as the scan output signal SDO through the pad P6, the test unit 300 may determine that the micro bumps 210 and 211 are electrically coupled to the second chip 200 and leakage current has not occurred in the micro bumps 210 and 211, and may sort the second chip 200 as a good product.

Conversely, if the scan input signal SDI inputted through the pad P5 is not normally outputted as the scan output signal SDO through the pad P6, the test unit 300 may determine that the micro bumps 210 and 211 are opened or short-circuited and are not appropriately electrically coupled to the second chip 200 or leakage current has occurred in the micro bumps 210 and 211, and may sort the second chip 200 as a bad product.

In the embodiment of the present disclosure, each of the respective chips 100 and 200 is not limited to a memory, and may be applied to all chips each of which has an interface structure through bumps for which a probe test may not be directly performed and uses boundary scan for stack. That is to say, the embodiment of the present disclosure is not limited to a memory, and may be applied to all chips which have bump pads and support a boundary scan function as a standard of JEDEC (Joint Electron Device Engineering Council).

Figure 5:
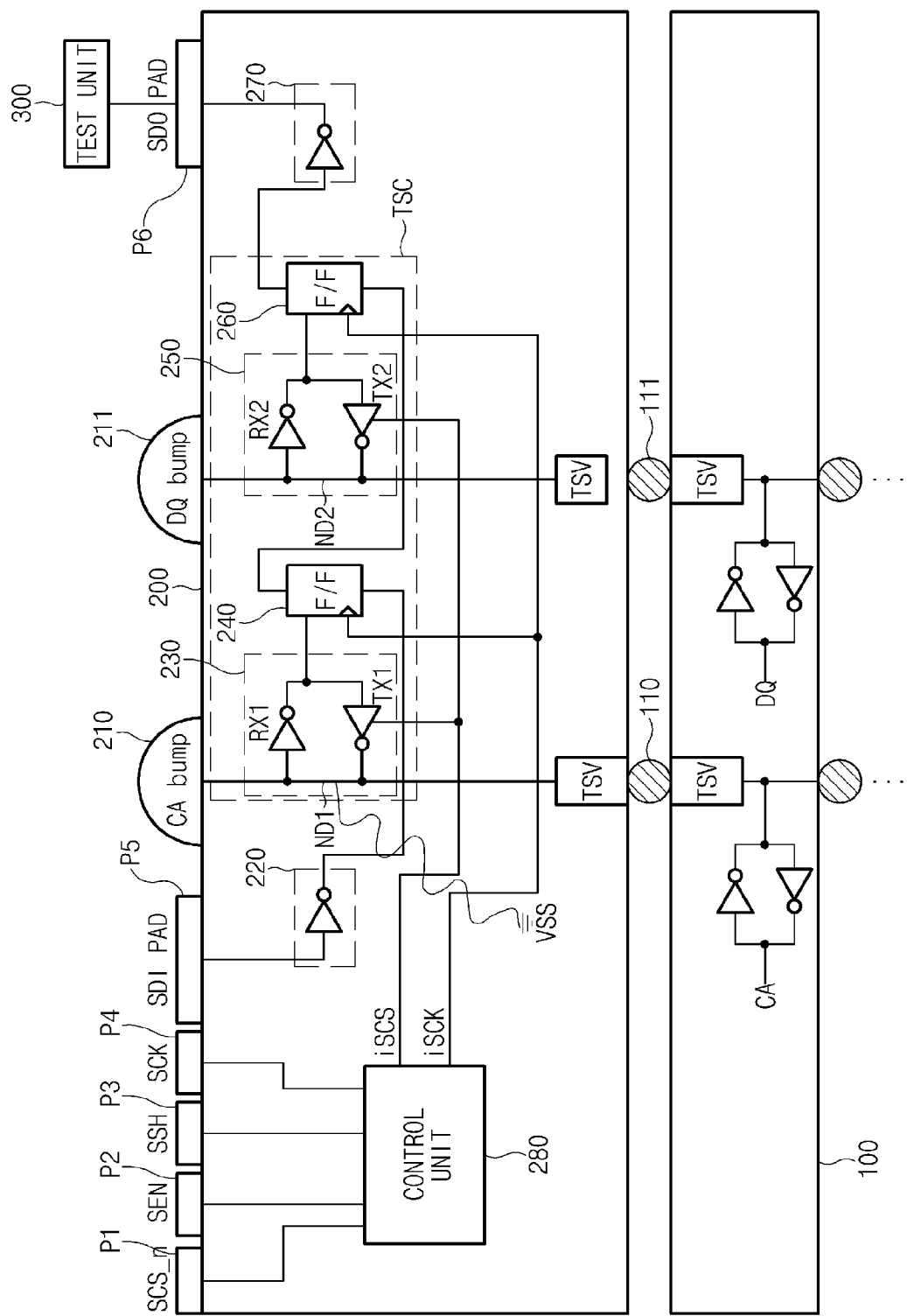
FIG. 5 is a diagram explaining a stack chip testing method in the embodiment of FIG. 4.

FIG. 5 is a diagram explaining a method for testing a bump fail in the embodiment of FIG. 4.

FIG. 5 shows a case where a ground (VSS) fail occurs and leakage current is produced in the node ND1 which is electrically coupled with the bump 210. Further, FIG. 5 shows a case where a through-silicon via TSV is not completely formed or a fail of a through-silicon via TSV occurs in the node ND2 which is electrically coupled with the bump 211.

In the embodiment of the present disclosure, by detecting changes in the amounts of capacitance of the floated nodes ND1 and ND2, it is possible to test a fail associated with the bumps 210 and 211.

Figure 6:
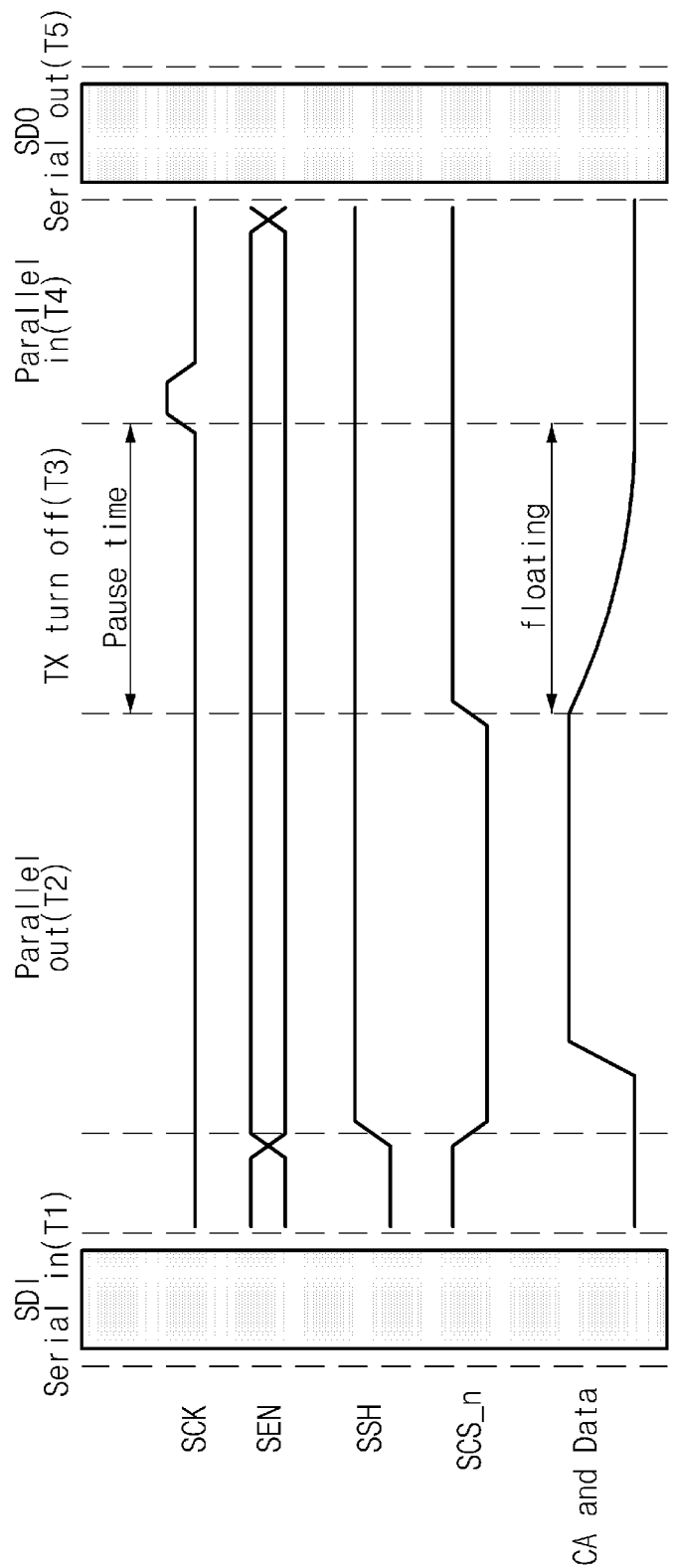
FIG. 6 is a timing diagram explaining a method for testing the stack chip in FIG. 5.

FIG. 6 is a timing diagram explaining a method for testing a bump fail as in FIG. 5.

First, the scan input signal SDI is inputted in series through the pad P5 (a period T1). Accordingly, the expected values of the respective bumps 210 and 211 are stored in the respective storage units 240 and 260 according to the data applied through the input buffers RX1 and RX2. The expected values stored in the respective storage units 240 and 260 may be data with the same level. The expected values stored in the respective storage units 240 and 260 may be logic high values or logic low values.

Thereafter, as the scan enable signal SEN is enabled, the scan shift signal SSH is enabled to a high level, and the scan chip select signal SCS_n becomes a low level. Then, the output buffer TX1 of the driving buffer 230 and the output buffer TX2 of the driving buffer 250 are turned on by the select signal iSCS. According to this fact, the data stored in the respective storage units 240 and 260 are outputted in parallel to the bumps 210 and 211 through the nodes ND1 and ND2 (a period T2).

Next, the scan chip select signal SCS_n becomes a high level. Then, the output buffer TX1 of the driving buffer 230 and the output buffer TX2 of the driving buffer 250 are turned off in response to the select signal iSCS (a period T3). According to this fact, as the driving buffers 230 and 250 do not operate for the period T3 as a pause time, the nodes ND1 and ND2 become floating states. Accordingly, data are charged in the nodes ND1 and ND2 by using the capacitance of the floated nodes ND1 and ND2.

At this time, a ground (VSS) fail may occur and a leakage path may be formed in the node ND1. Also, a through-silicon via TSV may not be completely formed or a fail of a through-silicon via TSV may occur in the node ND2.

In this case, the data corresponding to capacitance are not charged in the nodes ND1 and ND2 and capacitance leaks out due to leakage paths. For example, when the expected values stored in the storage units 240 and 260 are a logic high level, the values of the data corresponding to the capacitance stored in the nodes ND1 and ND2 in which leakage paths are formed are changed to a logic low level.

As the scan clock SCK toggles to a high level, the respective storage units 240 and 260 operate in response to the control clock iSCK (a period T4). Then, the data charged in the floated nodes ND1 and ND2 are inputted in parallel through the input buffers RX1 and RX2 of the driving buffers 230 and 250 and are stored in the storage units 240 and 260. At this time, since the capacitance stored in the nodes ND1 and ND2 leaks out through the leakage paths, the amounts of the capacitance stored in the storage units 240 and 260 gradually decrease.

If the scan enable signal SEN is enabled, a state results, in which the entire test scan chain TSC does not operate. The data stored in the respective storage units 240 and 260 are outputted in series as the scan output signal SDO through the pad P6 (a period T5). The external test unit 300 may detect a decrease in the read capacitance values of the respective storage units 240 and 260, and may determine in which bump the leakage current or a fail has occurred.

In the case where a leakage path is formed due to a power supply (VDD) fail, the same sequence may be progressed by storing expected values as a logic low level in the storage units 240 and 260. When the expected values are stored as a logic low level in the storage units 240 and 260, if leakage current occurs due to a power supply (VDD) fail, it is possible to detect a gradual increase in the capacitance values of the floating nodes ND1 and ND2 and determine in which bump the leakage current or a fail has occurred.

In the embodiment of the present disclosure, it is possible to test all pins which are electrically coupled to the test scan chain TSC, except a power bump. In other words, the embodiment of the present disclosure may be applied to all memory or logic chips which have bump types and use boundary scan. Also, in the embodiment of the present disclosure, in the case where through-silicon vias are not electrically coupled to bumps, it is possible to detect leakage current of the bumps. Further, in the embodiment of the present disclosure, in the case where through-silicon vias are electrically coupled to bumps, it is possible to detect the leakage, fail and incomplete forming of the through-silicon vias.

Figure 7:
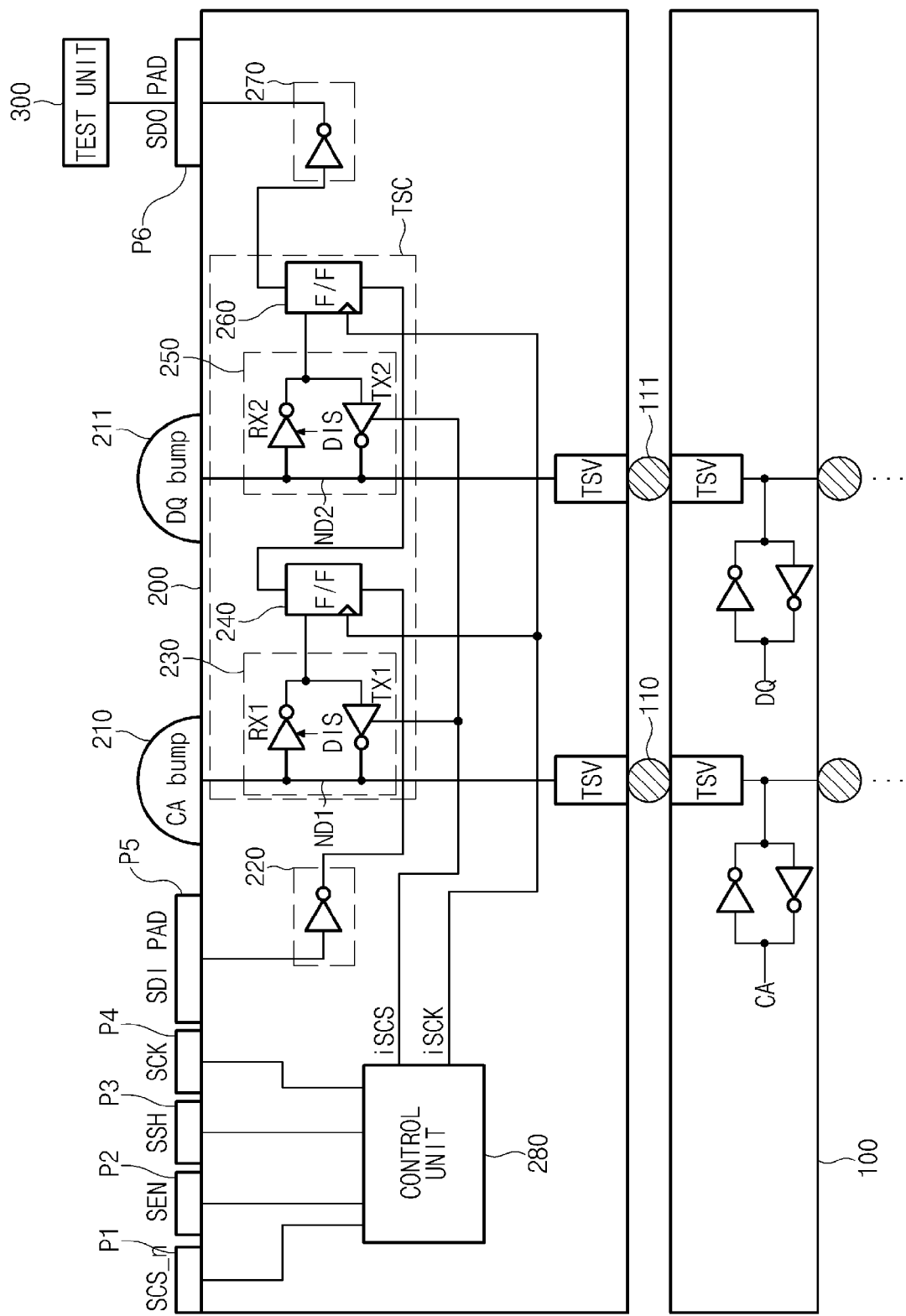
FIG. 7 is a configuration diagram of a stack chip in accordance with an embodiment of the present disclosure.

FIG. 7 is a configuration diagram of a stack chip in accordance with an embodiment of the present disclosure.

The stack chip in accordance with the embodiment of FIG. 7 is different from the stack chip in accordance with the embodiment of FIG. 4 in that input buffers RX1 and RX2 of driving buffers 230 and 250 are selectively turned off according to a control signal DIS.

In the driving buffers 230 and 250, if a scan chip select signal SCS_n becomes a high level, all output buffers TX1 and TX2 are turned off by a select signal iSCS. In the driving buffers 230 and 250 in accordance with the embodiment of FIG. 7, if the scan chip select signal SCS_n becomes the high level, the control signal DIS simultaneously becomes a high level.

If the control signal DIS becomes the high level, all the input buffers RX1 and RX2 of the driving buffers 230 and 250 are turned off. Due to this fact, capacitance may be charged more in floated nodes ND1 and ND2 than the case where only the output buffers TX1 and TX2 are turned off.

Figure 8:
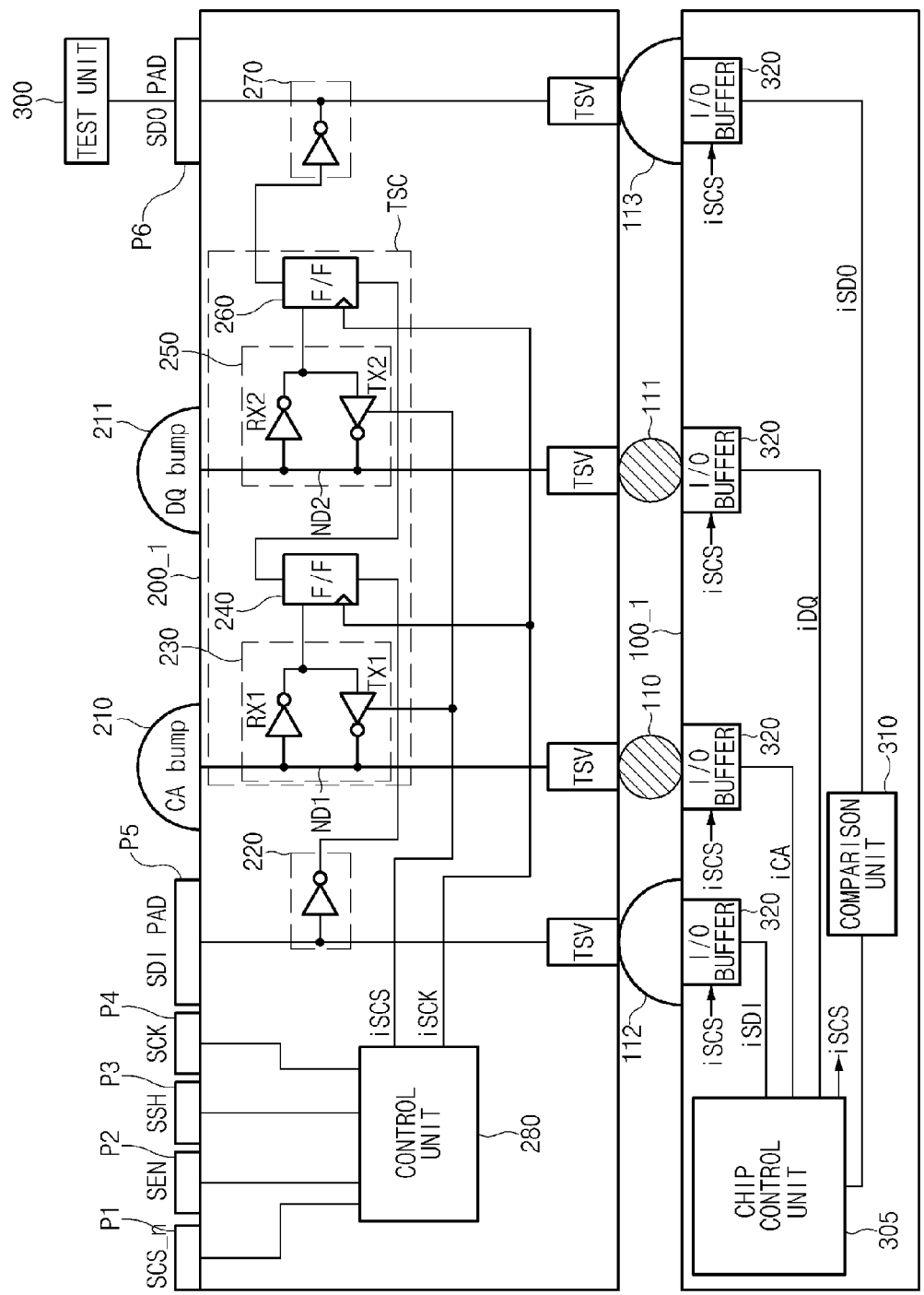
FIG. 8 is a configuration diagram of a stack chip in accordance with an embodiment of the present disclosure.

FIG. 8 is a configuration diagram of a stack chip in accordance with an embodiment of the present disclosure.

In a stack chip in accordance with an embodiment of FIG. 8, a first chip 100_1 and a second chip 200_1 are stacked. The first chip 100_1 and the second chip 200_1 may be electrically coupled with each other by micro bumps 110, 111, 112 and 113.

In the embodiment of FIG. 8, a pad P5 may be electrically coupled with the bump 112 through a through-silicon via TSV, and a pad P6 may be electrically coupled with the bump 113 through a through-silicon via TSV.

While it is described in the embodiment of FIG. 8 that the number of the bumps 112 and 113 is two, it is to be noted that the embodiment of the present disclosure is not limited to such and each chip may include a plurality of bumps.

In the embodiment of FIG. 8, the first chip 100_1 may be constituted by a system-on-chip, and the second chip 200_1 may be constituted by a semiconductor chip. While it is, for example, described in the embodiment of FIG. 8 that nodes ND1 and ND2 of the second chip 200_1 are electrically coupled with the first chip 100_1 through through-silicon vias TSV, it is to be noted that the embodiment of the present disclosure is not limited to such and both the first chip 100_1 and the second chip 200_1 may not include the through-silicon vias TSV and may be directly electrically coupled through the bumps 110, 111, 112 and 113.

The first chip 100_1 includes a chip control unit 305, a comparison unit 310, and input/output buffers 320.

The chip control unit 305 may be configured to generate a scan input signal iSDI and output the scan input signal iSDI to the bump 112. The bump 112 may operate as an input bump. The scan input signal iSDI may be stored in storage units 240 and 260 through the bump 112, the through-silicon via TSV and a buffer 220.

A scan output signal iSDO outputted through a buffer 270 may be inputted to the comparison unit 310 through the through-silicon via TSV and the bump 113. The bump 113 may operate as an output bump.

As may be readily seen, in the embodiment of FIG. 8, an input signal is not inputted to the storage units 240 and 260 through the pad P5 of the second chip 200_1, and instead, the scan input signal iSDI may be generated through the first chip 100_1 and be stored in the storage units 240 and 260 of the second chip 200_1.

Moreover, in the embodiment of FIG. 8, the data stored in the storage units 240 and 260 are not read through the pad P6 of the second chip 200_1, and instead, the scan output signal iSDO may be read through the first chip 100_1.

In this embodiment of FIG. 8, serial data are outputted through the chip control unit 305 of the first chip 100_1 to the second chip 200_1, and the serial data read through a test scan chain TSC are tested through the comparison unit 310 of the first chip 100_1.

Additionally, in the embodiment of FIG. 8, data may be outputted in parallel through the bumps 110 and 111 and be stored in the storage units 240 and 260, and the data stored in the storage units 240 and 260 may be read in parallel through the bumps 110 and 111, by which leakage current or a fail of bumps may be detected.

The chip control unit 305 generates an input signal iCA including a command and an address, and outputs the input signal iCA to the bump 110. The input signal iCA may be stored in the storage unit 240 through the bump 110, the through-silicon via TSV and an input buffer RX1 of a driving buffer 230. The chip control unit 305 outputs a select signal iSCS to the input/output buffers 320.

The chip control unit 305 generates data iDQ and outputs the data iDQ to the bump 111. The data iDQ may be stored in the storage unit 260 through the bump 111, the through-silicon via TSV and an input buffer RX2 of a driving buffer 250.

Namely, the chip control unit 305 transmits data in parallel through the respective bumps 110 and 111. The parallel data generated by the chip control unit 305 may be generated by external package balls. The parallel data outputted through the bumps 110 and 111 are stored in parallel in the storage units 240 and 260 through the input buffers RX1 and RX2 of the driving buffers 230 and 250.

The data stored in the respective storage units 240 and 260 are outputted in parallel to the nodes ND1 and ND2 through output buffers TX1 and TX2. Thereafter, in the state in which the output buffers TX1 and TX2 are turned off and the nodes ND1 and ND2 are floated, the data corresponding to the levels of capacitance are charged in the nodes ND1 and ND2.

In the course where the output buffers TX1 and TX2 are turned off and the nodes ND1 and ND2 are floated, the chip control unit 305 floats the input/output buffers 320 by using the select signal iSCS. According to this fact, the chip control unit 305 may prevent the capacitance charged in the nodes ND1 and ND2 from flowing to the first chip 100_1 while performing a floating operation using the select signal iSCS.

Such a chip control unit 305 may be inputted with a scan chip select signal SCS_n, a scan enable signal SEN, a scan shift signal SSH and a scan clock SCK which are inputted from an outside, and may control the level of the select signal iSCS.

The comparison unit 310 may read in parallel the data charged in the nodes ND1 and ND2 through the respective bumps 110 and 111, and may determine a fail or leakage current of the bumps 110 and 111. The comparison unit 310 is previously stored with the expected values of the data to be stored in the respective storage units 240 and 260. The comparison unit 310 compares the data of the nodes ND1 and ND2 read through the bumps 110 and 111 and the previously stored expected values, and detects a fail or leakage current of the bumps 110 and 111.

The comparison values outputted from the comparison unit 310 may be outputted to an outside through package balls. At the outside, by detecting the outputs of the package balls, the occurrence of a fail or leakage current of the bumps 110 and 111 may be checked.

As is apparent from the above descriptions, according to the embodiments of the present disclosure, it is possible to test leakage current of a bump, electrostatic discharge (ESD), a gate crack of an input/output buffer and a TSV (through-silicon via) fail, without directly probing bumps in a stack chip which is electrically coupled through the bumps.

Also, a leakage test may be easily performed for a large number of bumps through boundary scan, while obviating the need for adding a substantially large logic.

Further, in a mass production test, it is possible to easily find leakage of a bump and fail of a TSV.

While certain embodiments have been described above, it will be understood to those skilled in the art that the embodiments described are by way of example only. Accordingly, the semiconductor chip, the stack chip including the same and the testing method thereof described herein should not be limited based on the described embodiments. Rather, the semiconductor chip, the stack chip including the same and the testing method thereof described herein should only be limited in light of the claims that follow when taken in conjunction with the above description and accompanying drawings.

What is claimed is:

1. A semiconductor chip comprising:
an input pad and an output pad formed on the semiconductor chip;
at least one bump formed on the semiconductor chip; and
a test scan chain including: a plurality of drive buffers selectively driven by a selection signal; and a plurality of storage units electrically coupled in series, configured to store data received from the input pad and output the stored data to the output pad in response to a control clock,
wherein each of the plurality of drive buffers includes:
an input buffer configured to receive data from a node coupled to the bump and provide the received data to a corresponding storage unit; and
an output buffer configured to be selectively driven by the select signal, and output the data of the corresponding storage unit to the node, and
each of the plurality of drive buffers outputs the data stored in the plurality of storage units to the node when the output buffer is turned on, and floats the node for a predetermined time when the output buffer is turned off.

2. The semiconductor chip according to claim 1, further comprising:
a control unit configured to generate the select signal and the control clock according to signals which are applied from pads.

3. The semiconductor chip according to claim 1, wherein all data applied to the plurality of storage units through the input pad are data with the same logic level.

4. A stack chip comprising:
a first chip;
a second chip stacked over the first chip;
an input pad and an output pad formed on the second chip;
at least one bump configured to electrically couple the first chip and the second chip with each other; and
a test scan chain including: a plurality of drive buffers selectively driven by a selection signal; and a plurality of storage units electrically coupled in series, configured to store data received from the input pad and output the stored data to the output pad in response to a control clock,
wherein each of the plurality of drive buffers includes:
an input buffer configured to receive data from a node coupled to the bump and provide the received data to a corresponding storage unit; and
an output buffer configured to be selectively driven by the select signal, and output the data of the corresponding storage unit to the node, and
each of the plurality of drive buffers outputs the data stored in the plurality of storage units to the node when the output buffer is turned on, and floats the node for a predetermined time when the output buffer is turned off.

5. The stack chip according to claim 4, wherein the node electrically couples the bump and a through-silicon via.

6. The stack chip according to claim 4, wherein the test scan chain comprises:
a plurality of flip-flops configured to perform serial input/output operations between the input pad and the output pad in synchronization with a control clock, and perform parallel input/output operations with the node in synchronization with the control clock;
a plurality of input buffers electrically coupled between the node and the flip-flops, and configured to provide data stored in the node to the plurality of flip-flops; and
a plurality of output buffers configured to be retained in a turned-off state for a predetermined time according to a select signal, and provide data stored in the plurality of flip-flops to the node after the predetermined time has passed.

7. The stack chip according to claim 6, wherein, when the node is floated, the plurality of input buffers are turned off according to a control signal.

8. The stack chip according to claim 6, further comprising:
a control unit configured to generate the select signal and the control clock according to signals which are applied from pads.

9. The stack chip according to claim 6, wherein all data applied to the plurality of flip-flops through the input pad are data with the same logic level.

10. The stack chip according to claim 9, wherein a ground fail of the bump is tested when the data has a high logic level.

11. The stack chip according to claim 9, wherein a power supply fail of the bump is tested when the data has a low logic level.

12. A method for testing a stack chip, comprising:
storing data applied through an input pad, in respective storage units;
outputting data stored in the respective storage units, to nodes which are electrically coupled with bumps, when respective output buffers are turned on in correspondence to a select signal;
floating the nodes when driving buffers are turned off in correspondence to the select signal, and charging data corresponding to capacitance in the nodes for a predetermined time;
outputting the data corresponding to the capacitance, charged in the nodes, to the respective storage units in correspondence to a control clock; and
outputting data stored in the respective storage units, through an output node.

13. The method according to claim 12, further comprising:
discriminating a change in capacitance of the output node, and detecting a fail of the bumps, through a test unit.

14. A stack chip comprising: a first chip; a second chip stacked over the first chip; a plurality of bumps configured to electrically couple the first chip and the second chip with each other; and
a test scan chain including: a plurality of drive buffers selectively driven by a selection signal; and a plurality of storage units electrically coupled in series, configured to store data received from an input pad and output the stored data to an output pad in response to a control clock, wherein each of the plurality of drive buffers includes: an input buffer configured to receive data from a node coupled to the bump and provide the received data to a corresponding storage unit; and an output buffer configured to be selectively driven by the select signal, and output the data of the corresponding storage unit to the node, and each of the plurality of drive buffers outputs the data stored in the plurality of storage units to the node when the output buffer is turned on, and floats the node for a predetermined time when the output buffer is turned off.

15. The stack chip according to claim 14, wherein the test scan chain stores data in series through an input bump, and outputs the data in series through an output bump.

16. The stack chip according to claim 14, wherein the test scan chain comprises: a plurality of flip-flops configured to perform serial input/output operations between an input bump and an output bump in synchronization with a control clock, and perform parallel input/output operations with the node in synchronization with the control clock; a plurality of input buffers electrically coupled between the node and the flip-flops, and configured to provide data stored in the node to the plurality of flip-flops; and a plurality of output buffers configured to be retained in a turned-off state for a predetermined time according to the select signal, and provide data stored in the plurality of flip-flops to the node after the predetermined time has passed.

17. A stack chip comprising: a first chip; a second chip stacked over the first chip; a plurality of bumps configured to electrically couple the first chip and the second chip with each other; and
a test scan chain including: a plurality of drive buffers selectively driven by a selection signal; and a plurality of storage units electrically coupled in series, configured to store data received from an input pad and output the stored data to an output pad in response to a control clock, wherein each of the plurality of drive buffers includes: an input buffer configured to receive data from a node coupled to the bump and provide the received data to a corresponding storage unit; and an output buffer configured to be selectively driven by the select signal, and output the data of the corresponding storage unit to the node, and each of the plurality of drive buffers outputs the data stored in the plurality of storage units to the node when the output buffer is turned on, and floats the node for a predetermined time when the output buffer is turned off.

18. The stack chip according to claim 17, wherein the first chip comprises: a chip control unit configured to output a scan input signal in parallel to the plurality of bumps; and a comparison unit configured to compare a scan output signal applied from nodes through the plurality of bumps, with preset data, and output a signal.

* * * * *